(12) United States Patent
Kalnitsky et al.

(10) Patent No.: US 6,262,460 B1
(45) Date of Patent: Jul. 17, 2001

(54) LONG CHANNEL MOS TRANSISTOR THAT UTILIZES A SCHOTTKY DIODE TO INCREASE THE THRESHOLD VOLTAGE OF THE TRANSISTOR

(75) Inventors: Alexander Kalnitsky, San Francisco; Pavel Poplevine, Foster City; Albert Bergemont, Palo Alto, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/480,722

(22) Filed: Jan. 7, 2000

(51) Int. Cl.[7] .................................................. H01L 29/72
(52) U.S. Cl. .......................... 257/402; 257/471; 257/486; 438/237; 438/581
(58) Field of Search ................................. 257/402, 486, 257/471; 438/237, 581

(56) References Cited

U.S. PATENT DOCUMENTS

| Re. 35,221 | * | 4/1996 | Reay ..................................... 257/402 |
| 4,408,216 | * | 10/1983 | Gould ................................... 257/402 |
| 4,513,309 | | 4/1985 | Cricchi ................................... 357/42 |
| 5,648,678 | * | 7/1997 | Begley et al. ........................ 257/402 |
| 5,693,560 | * | 12/1997 | Hattori et al. ....................... 257/402 |

* cited by examiner

Primary Examiner—Edward Wojciechowicz
(74) Attorney, Agent, or Firm—Pillsbury Winthrop LLP

(57) ABSTRACT

When the threshold voltage of a long-channel transistor is set during the same dopant step of a manufacturing process that sets the threshold voltage of a short-channel transistor, the threshold voltage of the long-channel transistor is increased by connecting the long-channel transistor in series with a schottky diode.

15 Claims, 4 Drawing Sheets

LONG CHANNEL MOS TRANSISTOR THAT UTILIZES A SCHOTTKY DIODE TO INCREASE THE THRESHOLD VOLTAGE OF THE TRANSISTOR

BACKGROUND OF THE INVENTION

1. Field of the Invention

The present invention relates to a long-channel MOS transistor and, more particularly, to a long-channel MOS transistor that utilizes a schottky diode to increase the threshold voltage of the transistor.

2. Description of the Related Art

An n-channel metal-oxide-semiconductor (MOS) transistor is a four-terminal device which controls the current that flows between two of the terminals by modulating the voltage which is applied to the third or fourth terminal.

FIG. 1 shows a cross-sectional diagram of a conventional n-channel MOS transistor 100. As shown in FIG. 1, transistor 100 includes spaced-apart n+ source and drain regions 112 and 114 which are formed in a p-type substrate 110, and a channel region 116 which is defined between source and drain regions 112 and 114. Source and drain regions 112 and 114, in turn, represent the first two terminals of the device while substrate 110 represents the third terminal.

In addition, transistor 100 also includes a layer of gate oxide 120 which is formed over channel region 116, and a gate 122 which is formed over gate oxide layer 120. Gate 122 represents the fourth terminal of the device.

In operation, electrons flow from source region 112 to drain region 114 when an electric field is established between source and drain regions 112 and 114, the drain-to-substrate junction is reverse biased, and a gate voltage equal to or greater than the threshold voltage of transistor 100 is applied to gate 122. These conditions can be met, for example, when ground is applied to substrate 110 and source region 112, and one volt is applied to drain region 114.

The gate voltage applied to gate 122 attracts electrons to the surface of substrate 110 in channel region 116. When a minimum number of electrons has been attracted to the surface of substrate 110 in channel region 116, the electrons form a channel which allows the electrons in source region 112 to flow to drain region 114 under the influence of the electric field. The threshold voltage defines the minimum gate voltage that must be applied to gate 122 to attract the minimum number of electrons to the surface of substrate 110 to form the channel.

The threshold voltage of transistor 100 is adjusted by implanting the surface of substrate 110 in channel region 116 with an p-type dopant which, in turn, decreases the number of available electrons at the surface of substrate 110. Since fewer electrons are available, a higher gate voltage is needed to attract the minimum number of electrons that are required to form the channel.

MOS transistors are formed in a photolithograhpic process with a design rule that corresponds to the particular process being used. The design rule specifies, among other things, the minimum length of the channel region. To minimize the silicon area consumed by a MOS circuit, the circuit is largely implemented with transistors that have the minimum channel length.

Since the circuit is largely implemented with transistors that have the minimum channel length, the fabrication step that implants dopants into the surface of the substrate in the channel region is commonly optimized to adjust the threshold voltages of the transistors which have the minimum channel length.

One problem with this practice, however, is that circuits often require transistors which have channel lengths that are longer than the minimum. For those transistors with a longer channel length, a lower threshold voltage is realized when the threshold voltage is optimized for a shorter-channel transistor.

FIG. 2 shows a graph that illustrates threshold voltages versus channel lengths. As shown in FIG. 2, when the threshold voltage is optimized for a channel length x, the threshold voltage of a transistor decreases as the channel length of the transistor increases.

The reduced threshold voltages of the longer channel devices lead to increased leakage currents which, in turn, are particularly undesirable in circuits which are utilized in battery-operated devices.

One approach to this problem is to utilize multiple implant steps. In the first step, dopants are implanted into the surface of the substrate to adjust the threshold voltages of the short channel transistors while the long channel transistors are protected from the implant.

In the second step, dopants are implanted into the surface of the substrate to adjust the threshold voltages of the long-channel transistors while the short-channel transistors are protected from the implant. By utilizing two implant steps, the dopant concentration for the short and long channel lengths can be separately optimized.

The drawback to this approach, however, is that utilizing separate implant steps requires separate masks which, in turn, increases the cost of fabricating the circuit. Thus, there is a need for a long-channel MOS transistor which has a higher threshold voltage when the transistor is fabricated with a single threshold-voltage implant step that is optimized to set the threshold voltage of a short-channel transistor.

SUMMARY OF THE INVENTION

Conventionally, when the threshold voltage of a long-channel transistor is set during the same dopant step of a manufacturing process that optimizes the threshold voltage of a short-channel transistor, the process severely reduces the threshold voltage of the long-channel transistor. This reduction, in turn, leads to increased leakage currents. The present invention increases this reduced threshold voltage of the long-channel transistor by connecting the long-channel transistor in series with a schottky diode.

In accordance with the present invention, a threshold-voltage-adjusted transistor includes a first semiconductor material of a first conductivity type, and a second semiconductor material of a second conductivity type.

The threshold-voltage-adjusted transistor also includes a first transistor which is formed in the first semiconductor material. The first transistor has spaced-apart source and drain regions of the second conductivity type which are formed in the first semiconductor material, and a channel region which is defined between source and drain regions.

In addition, the first transistor also has a layer of gate oxide which is formed over the channel region, and a gate which is formed over the layer of gate oxide. The first transistor further has a channel length.

In accordance with the present invention, the threshold-voltage-adjusted transistor further includes a schottky diode which is formed in the second semiconductor material, and connected to the first transistor.

In addition, a second transistor, which has a channel length, is formed in the first semiconductor material. The channel length of the second transistor is substantially less than the channel length of the first transistor.

The present invention also includes a method for forming a circuit in a semiconductor material that has a first region of a first conductivity type and a second region of a second conductivity type. The method comprises the step of forming a short-channel transistor which has spaced-apart source and drain regions of the second conductivity type in the first region.

The method also includes the step of forming a long-channel transistor which has spaced-apart source and drain regions of the second conductivity type in the first region. The method further includes the step of forming a schottky diode. The schottky diode has a cathode formed by the second region, and an anode connected to the long-channel transistor.

The method additionally includes the step of doping the first region of the semiconductor material with a single masking step to set a threshold voltage in the first region. The threshold voltage is optimized for the short-channel transistor.

A better understanding of the features and advantages of the present invention will be obtained by reference to the following detailed description and accompanying drawings which set forth an illustrative embodiment in which the principles of the invention are utilized.

DETAILED DESCRIPTION

Figure 1:
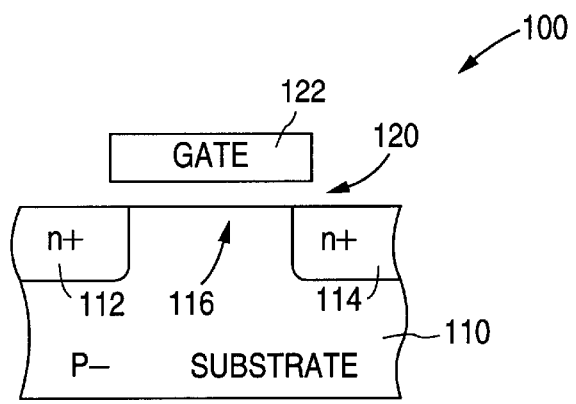
FIG. 1 is a cross-sectional diagram illustrating a conventional n-channel MOS transistor 100.
Figure 2:
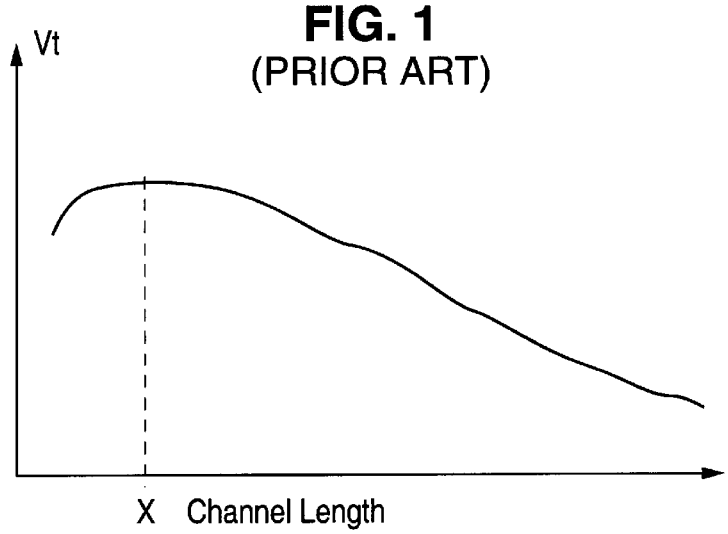
FIG. 2 is a graph illustrating threshold voltages versus channel lengths.
Figure 3:
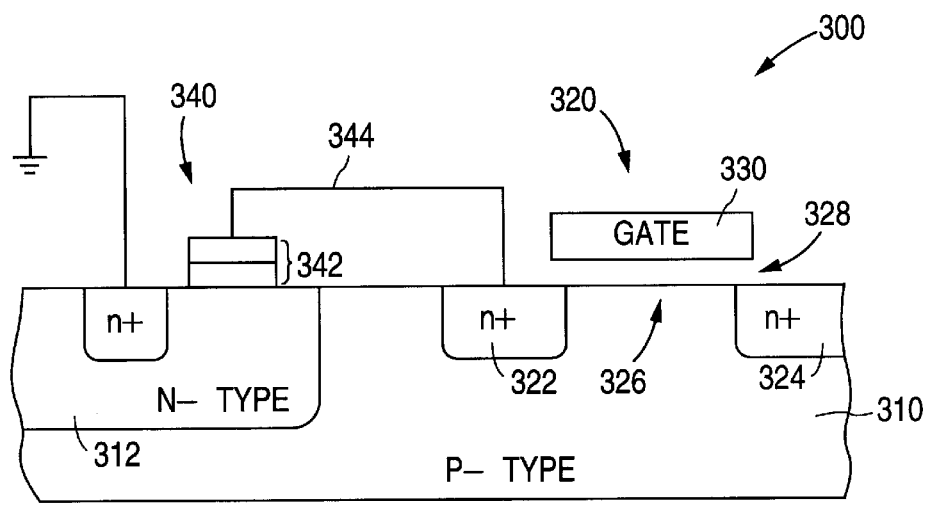
FIG. 3 is a cross-sectional diagram illustrating a threshold-voltage-adjusted transistor 300 in accordance with the present invention.

FIG. 3 shows a cross-sectional diagram that illustrates a threshold-voltage-adjusted transistor 300 in accordance with the present invention. As described in greater detail below, the threshold voltage of a long-channel transistor is increased by connecting the transistor in series with a schottky diode.

As shown in FIG. 3, transistor 300 includes a p-type semiconductor material 310, and a n-type semiconductor material 312. Semiconductor materials 310 and 312 may be substrates, epitaxial layers, and wells, and may be in contact with each other, such as when n-type material 312 is a well formed in p-type material 310 as shown in FIG. 3, or may be isolated from each other.

Transistor 300 also includes a long-channel transistor 320 which is formed in semiconductor material 310. Long-channel transistor 320 includes spaced-apart n+ source and drain regions 322 and 324, respectively, which are formed in semiconductor material 310, and a channel region 326 which is defined between source and drain regions 322 and 324.

In addition, long-channel transistor 320 also includes a layer of gate oxide 328 which is formed over channel region 326, and a gate 330 which is formed over gate oxide layer 328.

In accordance with the present invention, transistor 300 further includes a schottky diode 340 which has a cathode formed by semiconductor material 312, and an anode connected to source region 322 via a conductive line 344. Schottky diode 340 may be implemented in any conventional way.

As shown in FIG. 3, diode 340 preferably includes a diffusion barrier 342 which is formed over semiconductor material 312. Diffusion barrier 342 may include, for example, a layer of titanium (Ti) which is formed on semiconductor material 312, and an overlying layer of titanium nitride (TiN). Diffusion layer 342 is used to prevent junction spiking.

In operation, when the drain-to-source voltage is equal to or greater than the gate-to-source voltage less the threshold voltage, a current flows from the drain to the source of transistor 320 and through schottky diode 340. Schottky diode 340 increases the threshold voltage of transistor 320 which, in turn, significantly reduces the leakage currents associated with transistor 320.

Figure 4:
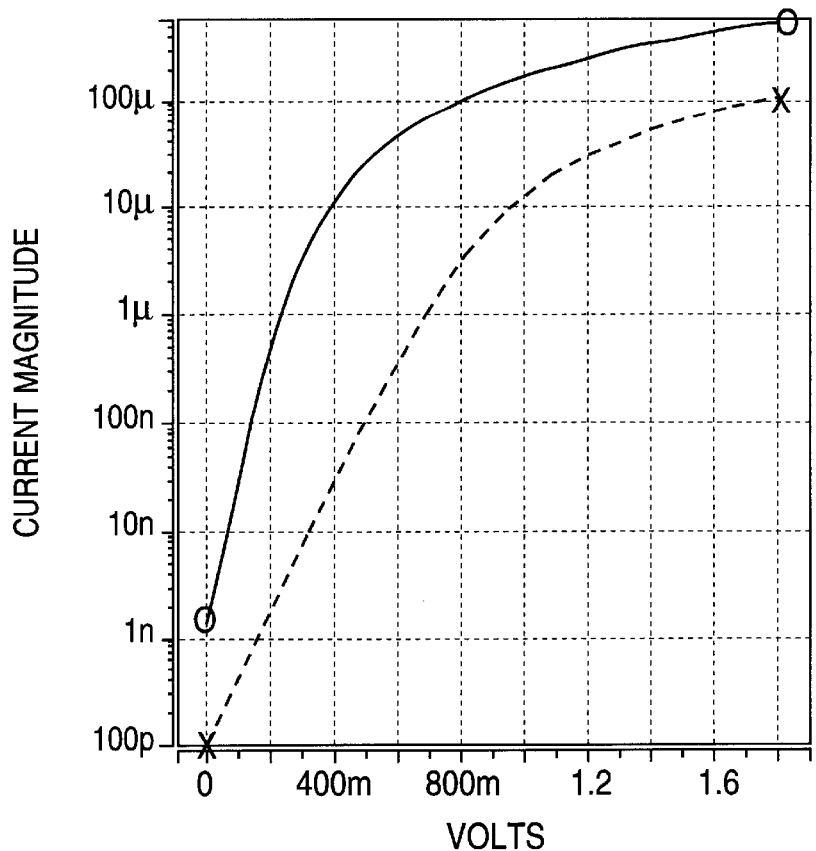
FIG. 4 is a graph comparing the drain currents versus gate voltages of transistor 300 and a conventional long-channel transistor which has a threshold voltage that was defined by a short-channel transistor.

FIG. 4 shows a graph that compares the drain currents versus gate voltages of transistor 300 (denoted by the X) and a conventional long-channel transistor which has a threshold voltage that was set to be optimized for a short-channel transistor (denoted by the O).

As shown in FIG. 4, the conventional long-channel transistor has a drain leakage current greater than 1 nA (when zero volts is applied to the gate, 1.8 volts is applied to the drain, and ground is applied to the source, and where the transistor has a channel length of approximately five microns).

On the other hand, transistor 300 of the present invention, has a drain leakage current of approximately 100 pA, more than a factor of 10 reduction (when zero volts is applied to gate 330, 1.8 volts is applied to drain region 324, and ground is applied to the semiconductor material 312, and where the transistor has a channel length of approximately five microns).

Figure 5:
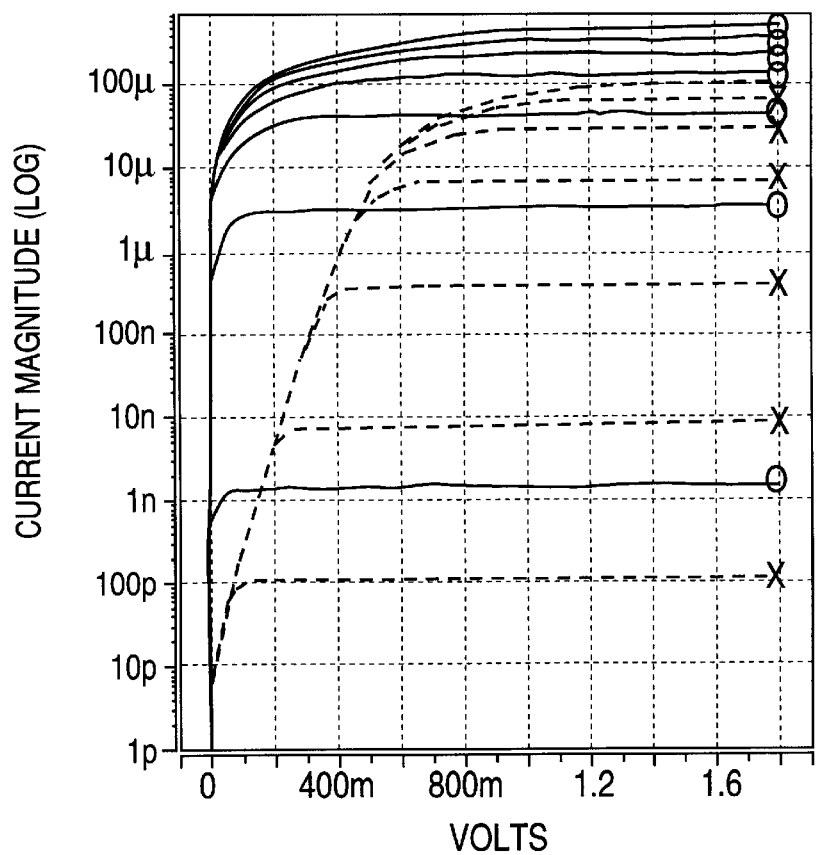
FIG. 5 is a graph comparing the drain currents versus the drain voltages of transistor 300 and the conventional long-channel transistor of FIG. 4 (plotted on semi-log).

FIG. 5 shows a graph that compares the drain currents versus drain voltages of transistor 300 (denoted by the X), and the conventional long-channel transistor of FIG. 4 (denoted by the O) (plotted on semi-log). As shown in FIG. 5, the drain current of transistor 300 is significantly less than the drain current of the conventional transistor when the drain voltage is near zero.

Figure 6A:
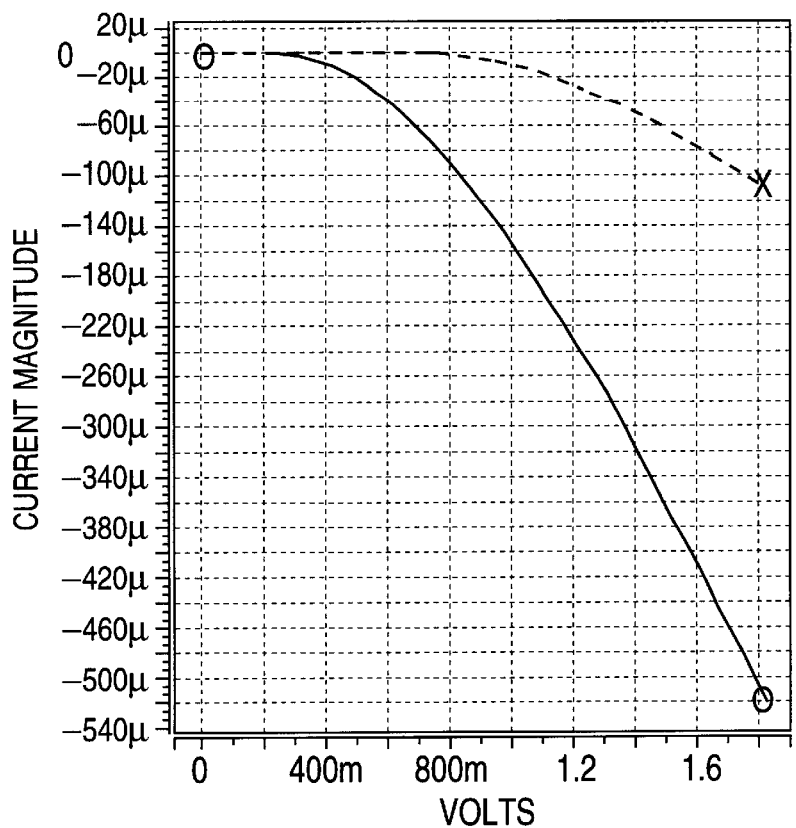
FIGS. 6A and 6B are graphs comparing the Id versus Vd (where Vd=Vg) (the saturation threshold voltage measurements) of transistor 300 with the Id versus Vd of the conventional long-channel transistor of FIG. 4 (FIG. 6B is plotted on semi-log).
Figure 6B:
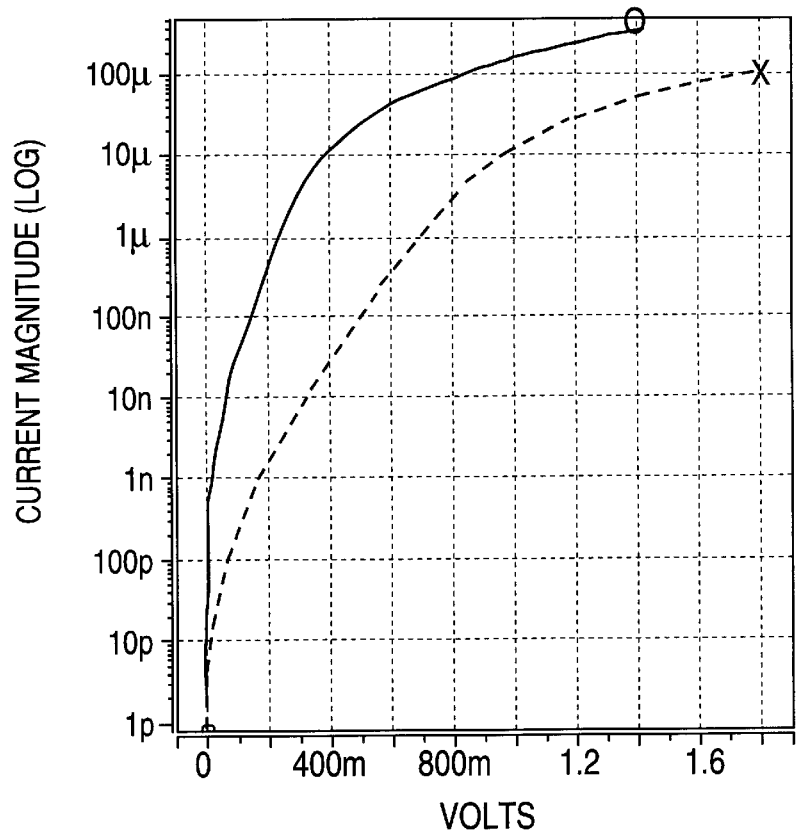

FIGS. 6A and 6B show graphs that compare the Id versus Vd (where Vd=Vg) (the saturation threshold voltage measurements) of transistor 300 (denoted by the X) with the Id versus Vd of the conventional long-channel transistor of FIG. 4 (denoted by the O) (FIG. 6B is plotted on semi-log). As shown in FIGS. 6A and 6B, transistor 300 has a higher threshold voltage (Vt) as well as a reduced subthreshold leakage current.

The present invention also includes a method for increasing the threshold voltage of a long-channel transistor of one conductivity type when the threshold voltage of the long-channel transistor is set with a single masking and doping step that is optimized to set the threshold voltage of a short-channel transistor of the same conductivity type.

Figure 7A:
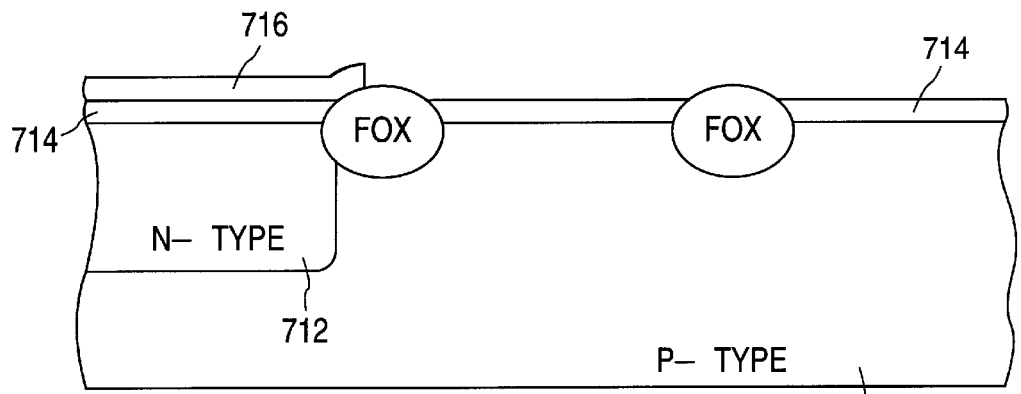
FIGS. 7A–7C are cross-section diagrams illustrating a method of the present invention.
Figure 7B:
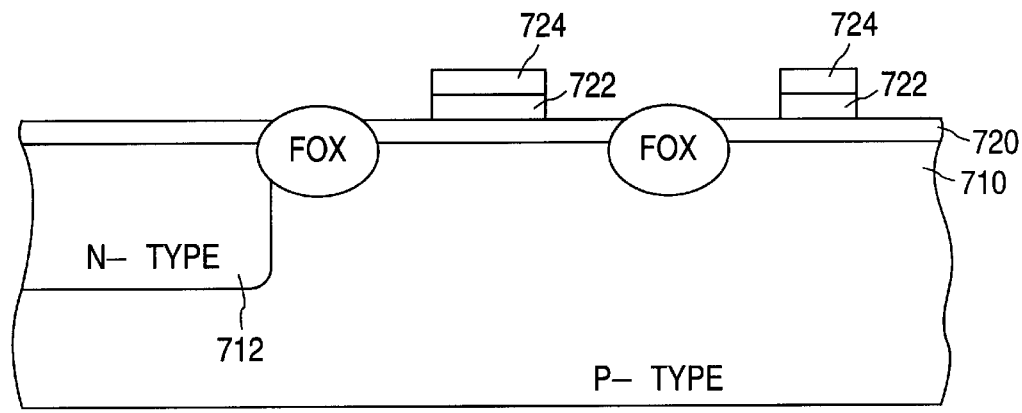
Figure 7C:
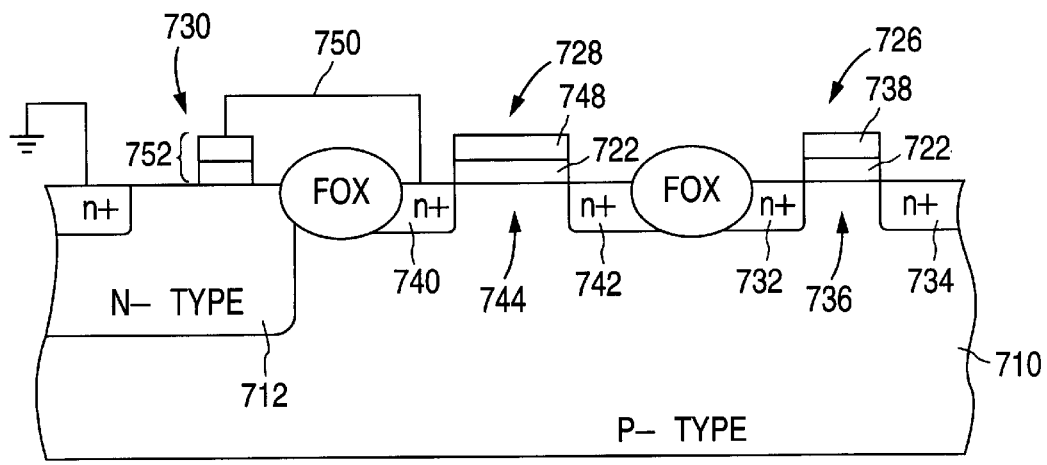

FIGS. 7A–7C show cross-section diagrams that illustrate the method of the present invention. As shown in FIG 7A, the method utilizes a conventionally-formed wafer that includes a p-type semiconductor material 710, a n-type semiconductor material 712, and a number of field oxide regions FOX.

Semiconductor materials 710 and 712 may be substrates, epitaxial layers, and wells, and may be in contact with each other, such as when n-type material 712 is a well formed in p-type material 710 as shown in FIG. 7A, or may be isolated from each other.

The method of the present invention begins by forming a layer of sacrificial oxide 714 on semiconductor materials 710 and 712, followed by the formation and definition of a mask 716. Mask 716 exposes the surface of p-type semiconductor material 710.

After mask 716 has been formed, p-type semiconductor material 710 is implanted with a dopant to set the threshold voltages of the n-channel transistors that are to be formed in material 710. In accordance with the present invention, the amount of dopant implanted into material 710 and the implant energies are defined to optimize the operation of the shortest channel-length transistors that are to be formed in material 710.

Material 710 is also implanted during this step to form an anti-punchthrough region, and to set the dopant concentration of material 710 (the implant step used to set the dopant concentration of material 710 may be omitted if material 710 is formed as a well and already has the necessary dopant concentration). After this, mask 716 is removed.

A second mask is then formed on semiconductor materials 710 and 712. The second mask exposes all or a part of the surface of n-type semiconductor material 712. After the second mask has been formed, n-type semiconductor material 712 is implanted with a dopant to set the threshold voltages of the p-channel transistors that are to be formed in material 712.

Material 712 is also implanted during this step to form an anti-punchthrough region, and to set the dopant concentration of material 712 (the implant step used to set the dopant concentration of material 712 may be omitted if material 712 is formed as a well and already has the necessary dopant concentration). After this, the second mask and the sacrificial oxide layer are removed.

Next, as shown in FIG. 7B, a layer of gate oxide 720 is formed on the surface of semiconductor materials 710 and 712, followed by the deposition of an overlying layer of polysilicon (poly) 722. After this, a third mask 724 is formed and patterned on poly layer 722. Once mask 724 has been patterned, poly layer 722 is etched to define the gates of the transistors.

Conventional steps are then followed to form a short-channel NMOS transistor 726 in material 710, a long-channel NMOS transistor 728 in material 710, and a schottky diode 730 in semiconductor material 712.

As shown in FIG. 7C, following these conventional fabrication steps, short-channel NMOS transistor 726 includes spaced-apart source and drain regions 732 and 734, respectively, which are formed in material 710, and a channel region 736 which is defined between source and drain regions 732 and 734. In addition, transistor 726 includes gate oxide layer 722 which is formed over channel region 736, and a gate 738 which is formed over gate oxide layer 722 over channel region 736.

Similarly, long-channel NMOS transistor 728 includes spaced-apart source and drain regions 740 and 742, respectively, which are formed in material 710, and a channel region 744 which is defined between source and drain regions 740 and 742. In addition, transistor 728 includes gate oxide layer 722 which is formed over channel region 744, and a gate 748 which is formed over gate oxide layer 722 over channel region 744. One way that long-channel transistor 728 differs from short-channel transistor 726 is the channel length of long-channel transistor 728 is greater than the channel length of short-channel transistor 726.

In accordance with the present invention, schottky diode 730 has a cathode formed by semiconductor material 712, and an anode connected to source region 740 via a conductive line 750. Schottky diode 730 preferably includes a diffusion barrier 752 which is formed over semiconductor material 712 and connected to line 750. Diffusion barrier 752 may include, for example, a layer of titanium (Ti) which is formed on semiconductor material 712, and an overlying layer of titanium nitride (TiN).

Thus, one of the advantages of the present invention is that only a single masking step is required to set the threshold voltages of both the short and long-channel transistors. As a result, the present invention eliminates the costs associated with using multiple masking steps to set the threshold voltages.

Although a single masking step has heretofore produced long-channel transistors with a severely reduced threshold voltage, the inclusion of a schottky diode having an anode connected to the source of the long-channel transistor increases and provides a more optimized threshold voltage for the long-channel transistor.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A threshold-adjusted transistor, the transistor comprising:
    a first semiconductor material of a first conductivity type;
    a second semiconductor material of a second conductivity type, the second semiconductor material contacting the first semiconductor material;
    a first transistor formed in the first semiconductor material, the first transistor having;
        spaced-apart source and drain regions of the second conductivity type formed in the first semiconductor material;
        a channel region defined between source and drain regions;
        a layer of gate oxide formed over the channel region; and
        a gate formed over the layer of gate oxide; and
    a schottky diode formed in the second semiconductor material, the schottky diode having an anode connected to the first transistor.

2. The threshold-adjusted transistor of claim 1 wherein the anode is connected to the source of the first transistor.

3. The threshold-adjusted transistor of claim 1 wherein the schottky diode includes a diffusion barrier connected to the second semiconductor material.

4. The threshold-adjusted transistor of claim 3 wherein the diffusion barrier includes:

a layer of titanium formed on the second semiconductor material; and a layer of titanium nitride formed on the layer of titanium.

5. The threshold-adjusted transistor of claim 3 and further comprising a conductive line connected to the diffusion barrier and the source of the first transistor.

6. The threshold-adjusted transistor of claim 2 wherein the second semiconductor material is connected to a relative ground potential.

7. The threshold-adjusted transistor of claim 3 wherein the second semiconductor material is connected to a relative ground potential.

8. The threshold-adjusted transistor of claim 1 wherein the first transistor has a channel length, and further comprising a second transistor formed in the first semiconductor material, the second transistor having a channel length, the channel length of the second transistor being substantially less than the channel length of the first transistor.

9. The threshold-adjusted transistor of claim 2 wherein the first transistor has a channel length, and further comprising a second transistor, the second transistor having a channel length, the channel length of the second transistor being substantially less than the channel length of the first transistor.

10. A method for forming a circuit in a semiconductor material having a first region of a first conductivity type and a second region of a second conductivity type that contacts the first region, the method comprising the steps of:

forming a short-channel transistor, the short-channel transistor having spaced-apart source and drain regions of the second conductivity type formed in the first region;

forming a long-channel transistor, the long-channel transistor having spaced-apart source and drain regions of the second conductivity type formed in the first region; and forming a schottky diode, the schottky diode having a cathode formed by the second region, and an anode connected to the long-channel transistor.

11. The method of claim 10 and further comprising the step of:

doping the first region of the semiconductor material with a single masking step to set a threshold voltage in the first region, the threshold voltage being optimized for the short-channel transistor.

12. The method of claim 10 wherein the anode is connected to the source of the long-channel transistor.

13. The method of claim 10 wherein the schottky diode includes a diffusion barrier connected to the second region.

14. The method of claim 13 wherein the diffusion barrier includes:

a layer of titanium formed on the second region; and a layer of titanium nitride formed on the layer of titanium.

15. The method of claim 13 and further comprising a conductive line connected to the diffusion barrier and the source of the long-channel transistor.

* * * * *